United States Patent [19]

Underhill et al.

[11] 4,283,794
[45] Aug. 11, 1981

[54] MEASURING RADIO-FREQUENCY IMPEDANCE

[75] Inventors: Michael J. Underhill, Faygate; Peter A. Lewis, Brighton, both of England

[73] Assignee: U.S. Philips Corporation, New York, N.Y.

[21] Appl. No.: 21,760

[22] Filed: Mar. 19, 1979

[30] Foreign Application Priority Data

Mar. 20, 1978 [GB] United Kingdom ............... 10888/78

[51] Int. Cl.³ .................... H04B 17/00; G01R 27/08; G01R 27/16
[52] U.S. Cl. ................................. 455/226; 324/57 R; 324/58 A
[58] Field of Search ......................... 325/363, 67, 174; 324/57 R, 58 A; 455/226, 67, 123

[56] References Cited

U.S. PATENT DOCUMENTS

| 3,179,881 | 4/1965 | Ichijo | 324/57 R |
|---|---|---|---|
| 3,218,549 | 11/1965 | Tsuchiya | 324/57 R |
| 3,596,175 | 7/1971 | Alford | 324/58 A |
| 3,919,644 | 11/1975 | Smolka | 325/174 |
| 4,156,842 | 5/1979 | Huang et al. | 324/57 R |

*Primary Examiner*—Marc E. Bookbinder
*Attorney, Agent, or Firm*—Thomas A. Briody; William J. Streeter; Edward W. Goodman

[57] ABSTRACT

A method and apparatus for deriving radio-frequency impedance information of an electrical network, for example, an aerial, by using a current converter for inducing a radio-frequency current into the network and a voltage converter for impressing a radio-frequency voltage on the network. By applying radio-frequency signals to the converters, the resultant signals present in the network may be detected by connecting a radio receiver to the network, from which detected signals the impedance may be derived. By directly connecting the radio receiver to the network, the radio-frequency energy applied to the network by the converters may be kept very small.

8 Claims, 16 Drawing Figures

4,283,794

MEASURING RADIO-FREQUENCY IMPEDANCE

BACKGROUND OF THE INVENTION

This invention relates to a method of deriving radio-frequency impedance information of a network by applying radio-frequency energy to the network, extracting signals at radio frequency from the network and deriving the impedance information with the aid of a detector to which the extracted signals are fed. The invention also relates to apparatus for carrying out such a method. The method and apparatus can be used, for example, to match a radio transmitter or receiver to an aerial.

Such an arrangement is disclosed, for example, in British Pat. No. 1,330,016 which relates to impedance-transforming apparatus for matching a load to a power source and in particular for matching an aerial to a radio transmitter. The specification describes an arrangement which includes a detector which, when energy is supplied by the transmitter to the aerial, senses the magnitude and phase angle of the aerial impedance as transformed by a tuning unit connected between the transmitter and the aerial. The data derived by the detector are fed to a servo amplifier which controls motors mechanically coupled to a variable inductor and a variable capacitor in the tuning unit.

Automatic matching of an aerial to the output of a transmitter is also known for example from British Pat. Nos. 881,018 and 1,412,314. A technique for adjusting components of an aerial matching unit is described by M. J. Underhill and P. A. Lewis in "Automatic tuning of antennae," SERT Journal, September 1974, page 183.

In previous arrangements such as those referred to above it is necessary to supply the load with a sufficiently large amount of energy to permit the detector or detectors to function adequately.

SUMMARY OF THE INVENTION

It is an object of the present invention to provide a method of deriving radio-frequency impedance information which requires the use of less radio frequency energy than is required by previously-known methods. Another object of the invention is to use a radio receiver as a form of sensitive detecting instrument.

In this context the words "radio receiver" are to be construed as a compendious term to denote a device which can be coupled to an aerial or other source of radio signals in order to make available in some desired form the required information content of the signals; such information content may be represented, for example, by the magnitude of the radio signals.

According to the invention therefore a method of the kind set forth in the opening paragraph of this specification is characterised in that the information is derived with the aid of a signal-detector in the form of a radio receiver and with the aid of a source of radio-frequency signals, comprising the steps of providing a set of at least two converters comprising a current converter for introducing a radio-frequency current into the network and a voltage converter for impressing a radio-frequency voltage on the network, applying signals from the radio-frequency source to the set of converters to couple the said current and voltage into the network, detecting the resultant signal or signals with the radio receiver by coupling the receiver to a port of the network and deriving the impedance information from the detected signal or signals.

As can be clearly appreciated, when the invention is applied to the process of matching the impedance of an aerial to a radio receiver or a radio transmitter-receiver combination, it has a further advantage over previously-proposed methods in that during the impedance measurement and matching process, the radio receiver remains connected in the normal position for radio reception and thus can continue to receive radio transmissions.

If sinusoidal amplitude modulation is applied to one or both of the converters, the signal demodulated by the receiver will include a component at the fundamental modulation frequency and this fundamental component will go to zero when the impedance vector of the network under test lies on a defined circle in a diagram representing the complex impedance plane.

Thus, a method embodying the invention may be characterised in that it comprises the steps of amplitude modulating a signal applied from the radio-frequency source to at least one of the converters and demodulating the amplitude-modulated signal at the receiver whereby, as a point representing impedance presented by the network approaches a circular locus in a diagram in a complex impedance plane, the fundamental component of the modulation frequency in the demodulated signal approaches zero.

If it is desired to find whether the phase angle of an impedance is positive or negative, then the invention can enable such phase analysis by means of a phase modulation method. Suitably, such a phase modulation method comprises applying to the two converters respective radio signals of which the carriers are in phase, and of which signals one is phase modulated, and also comprising providing in the receiver an amplitude demodulator whereby the sign of the fundamental component of the demodulated signal indicates the sign of the phase of the impedance presented to the set of transducers by the network.

Alternatively, the invention provides a phase shift method comprising applying to the two converters respective radio signals which differ in phase by 90 degrees and one of which signals is amplitude modulated and has its carrier suppressed, together with means for demodulating the received signal whereby the sign of the fundamental component of the demodulated signal indicates the sign of the phase of the impedance presented to the set of transducers by the network.

The fundamental modulation component may be extracted, at the radio receiver, with the aid of a synchronous demodulator operating at the modulation frequency.

The method may be extended to derive impedance information at each of a plurality of locations in the network by employing a plurality of sets of converters.

Another object of the invention is to provide an apparatus for carrying out methods of deriving impedance information as discussed above and to this end according to the invention there is provided a transmission path connectable at one end to said network, a current converter connected in the path for introducing a radio-frequency current into the network, a voltage converter connected in the path for impressing a radio-frequency voltage on the network and means at the other end of the path for connecting a radio receiver to the path to provide an output indicative of an impedance parameter of the network.

Suitably, the transmission path comprises a variable reactor.

The apparatus may comprise means such as a servo mechanism for automatically varying such a reactor in response to the output from the radio receiver.

The signal applied to at least one of the converters may be amplitude modulated, in which case the radio receiver may have a synchronous demodulator operable at the modulation frequency.

DESCRIPTION OF THE DRAWINGS

Embodiments of the invention will now be described by way of example with reference to the diagrammatic drawings in which.

DESCRIPTION OF THE PREFERRED EMBODIMENTS

Figure 1:
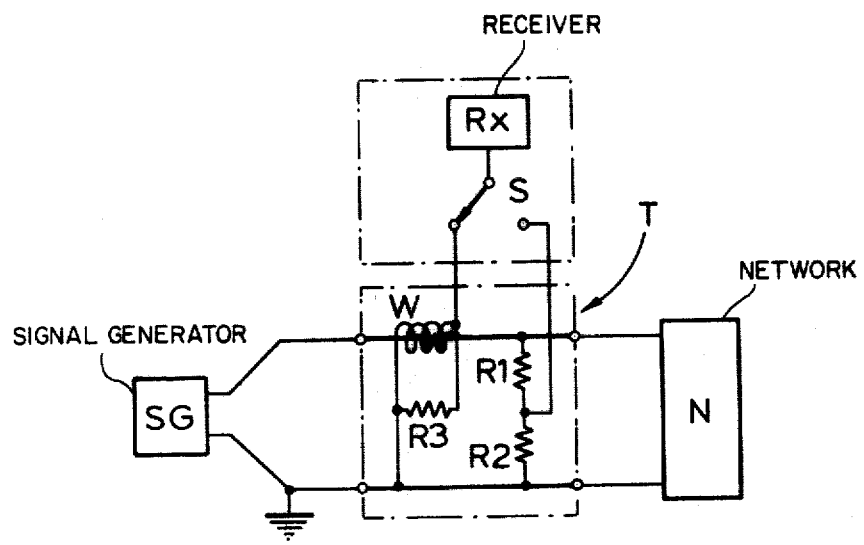
FIG. 1 illustrates known arrangements.
Figure 2:
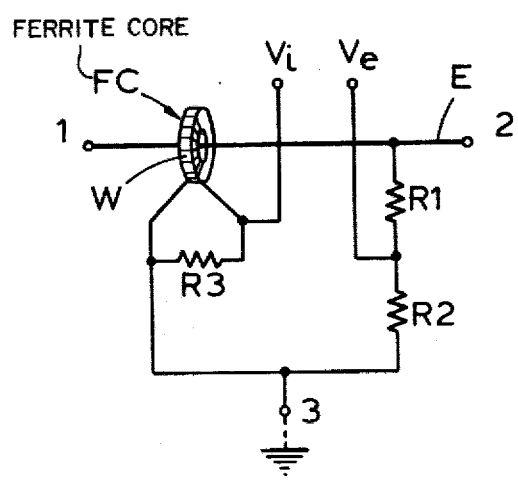
FIG. 2 illustrates a signal-coupling arrangement.

Referring first to FIG. 1 this illustrates in one simple form the procedure common to all known arrangements. A network N which may include variable impedance-matching reactors is fed with energy from a radio frequency signal generator SG, with a measuring device T between the network and the signal generator and a radio-frequency detector such as, for example as a radio receiver Rx which, for example, can be connected through a switch S alternately to one or the other of the measuring devices so as to compare the signals derived from them. If the switch S is electronic and is operated at an audio frequency, the detected output of the receiver Rx will also be at audio frequency. The measuring device T is illustrated in FIG. 2 and comprises a conductor E extending between input and output terminals 1 and 2, respectively. The conductor E passes through a ferrite core FC upon which is wound a toroidal winding W. Between the conductor E and a common terminal 3, which in practice will almost always be connected to ground, is a potential divider formed by resistors R1 and R2. Between terminals $V_i$ and $V_e$ and common terminal 3 there will thus appear, when a current is flowing along the conductor E, two voltages, one induced in the winding W by the current transformer formed by winding W and the conductor E, and the other derived from the potential divider formed by R1 and R2.

Figure 3:
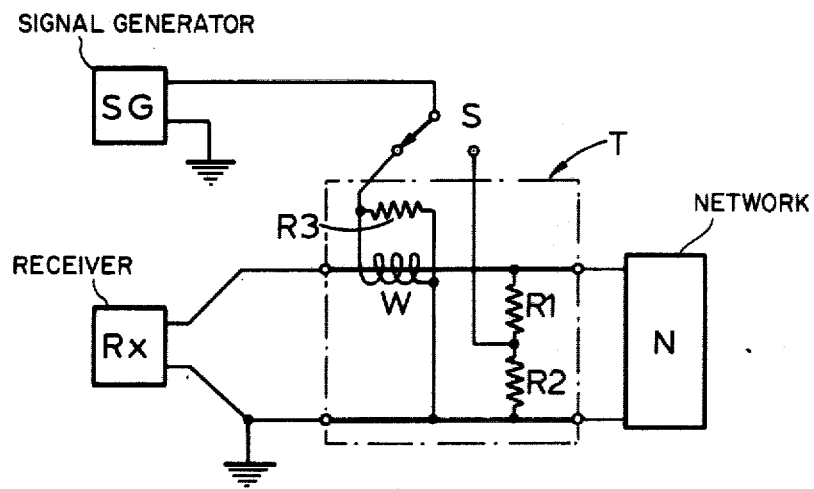
FIG. 3 illustrates a simple embodiment.

Referring now to FIG. 3, this is a similarly simple arrangement which serves to illustrate the principle of the present invention and it will be seen that the detector Rx and the signal generator SG have been interchanged so that the detector is connected directly to the newtork while the applied R.F. energy is coupled to the network through the device T.

Thus an arrangement embodying the invention works in reverse to all the arrangements hitherto proposed and the device T no longer acts as a measuring device, although of exactly the same configuration as heretofore, but as a signal coupling device comprising a current converter R1 and R2, FIG. 2, and a voltage converter W, FC and R3. This reversal is possible because the complete arrangement of the load network including variable reactors if any, converters, and impedance presented by the signal generator or detector as the case may be, can be considered as a passive reciprocal network.

Measurements made by a method embodying the invention require no greater signal to be injected into the network than will provide adequate indication by the detector or other indicating instrument used. Since the detector is a radio receiver which is a particularly sensitive instrument, it is apparent that the applied injected signal can be very small indeed, the actual level of this injected signal being of the order of, for example, 1 nanowatt or less.

It will be understood that since the output of the radio receiver contains the same information as that available when using known methods, this information can be used in known manner to control servo or other mechanisms to adjust variable reactors in the network so as to achieve a required load impedance. Such arrangements are disclosed in the specification referred to above.

Figure 4:
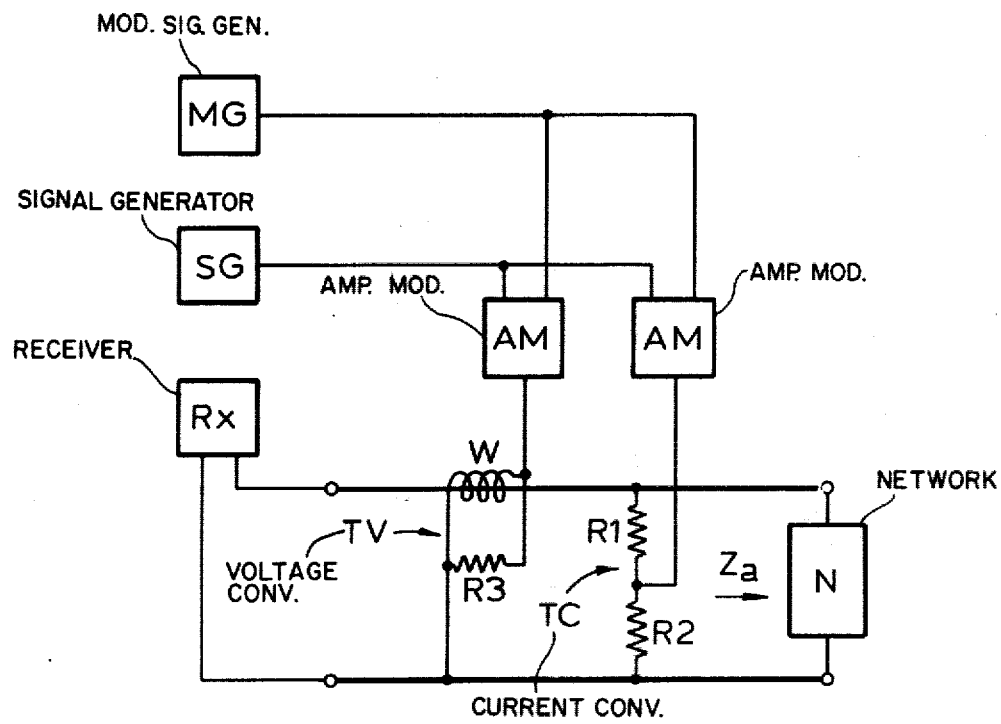
FIG. 4 illustrates a second embodiment.

Referring to FIG. 4, this illustrates an embodiment in which the switch S is replaced by two amplitude modulators AM supplied from a modulation signal generator MG and from the R.F. signal generator SG. The resistors R1 and R2 form a current converter TC, and a voltage converter TV is again formed by components W and R3. It can be seen that if the modulating signal from MG is a suitable square wave, this arrangement is merely an automatically operating version of the arrangement of FIG. 3. Unfortunately, the harmonic content of square wave modulation can cause problems in a practical system, due to the peculiar phase response of some receivers. Sinusoidal modulating avoids these difficulties.

Figure 5:
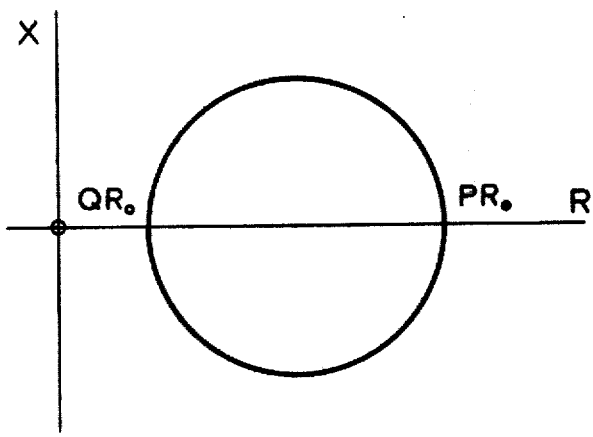
FIGS. 5 to 9 are impedance-plane diagrams.

It can be shown that if sinusoidal amplitude modulation of frequency f is applied to both the voltage and the current signals as illustrated in FIG. 4 then, in general, the signal demodulated by the receiver includes a component at the fundamental modulation frequency f and this fundamental component will approach zero when a point representing the impedance $Z_a$ under test approaches a circular locus in a diagram representing a complex impedance plane: as illustrated in FIG. 5 the circle is always centered on the resistance axis R and intersects this axis at the points $$R = PR_o \text{ and } R = KPR_o = QR_o$$

where, putting $A_{cv}$ and $A_{ci}$ as the respective carrier levels of the signals applied to the voltage and current transducers, $A_{sv}$ and $A_{si}$ as the respective sideband levels and $k_v$ and $k_i$ as the respective modulation factors we may write:

$$A_{cv}/A_{ci} = P; k_v/k_i = K$$

$$A_{sv}/A_{si} = Q = KP$$

In practice the fundamental component may be extracted at the receiver audio output by synchronous detection at the modulation frequency. The polarity of the detected signal will indicate on which side of the chosen locus lies the impedance $Z_a$ presented to the transducers by the network N under test, see FIG. 4.

By suitable choice of values for the carrier ratio, P, and the sideband ratio, Q, several useful impedance loci may be defined.

In simple amplitude modulation schemes, Q will be adjusted by altering the modulation index ratio, K, and will be directly dependent upon the value of P. However, in some embodiments, for example a balanced modulator arrangement, Q can be adjusted directly and can be independent of P. Some methods of obtaining useful loci will now be briefly considered.

Figure 6:
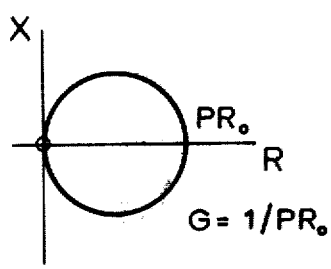

If $Q=0$, that is to say the carrier energy applied to the voltage converter is unmodulated, the null locus will be a circle intersecting the resistive axis R at $PR_o$ and at the origin. Such a circle defines a locus of constant conductance $G=1/PR_o$ as illustrated in FIG. 6. Alternatively, in schemes providing independent adjustment of Q, P may be set to zero with sidebands only, but with no carrier applied to the voltage converter. The resulting circle defines a locus of constant conductance $1/QR_o$: note that in this case although P is zero, Q is not.

If $Q=-P$ for example by making $K=-1$, that is to say with the modulations equal in amplitude but opposite in phase, the null locus will be a circle intersecting the resistive axis R at $PR_o$ and $-PR_o$. Such a circle will be centered on the origin and will define a locus of constant modulus $P \cdot R_o = |Z|$, FIG. 7. Instead of setting the modulations in antiphase, the carriers themselves can be set in antiphase: the system will behave in a similar way.

If there is no modulation on the current converter signal, the null locus will be a "circle" intersecting the resistive axis R at $PR_o$ and at infinity, so that the circle reduces to a line parallel with the reactive axis R. Such a line defines a locus of constant resistance $R=PR_o$, FIG. 8. Alternatively, in schemes providing independent adjustment of Q, P may be set to infinity, that is to say there are sidebands but no carrier in the signal applied to the current converter. The resulting line defines a locus of constant resistance $QR_o$; note that although P is infinite and K infinitely small, Q is finite.

Figure 9:
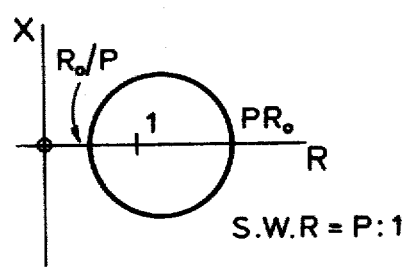

If $Q=1/P$ the null locus will be a circle intersecting the resistive axis R at $PR_o$ and $R_o/P$. Such a circle defines a locus of constant standing wave ratio $SWR=P:1$ as illustrated in FIG. 9.

It may be desired to find whether the phase angle of an impedance is positive or negative. Two embodiments of the invention which enable such phase analysis and which can conveniently be referred to as a phase modulation method and a phase shift method will now be described.

Figure 10:
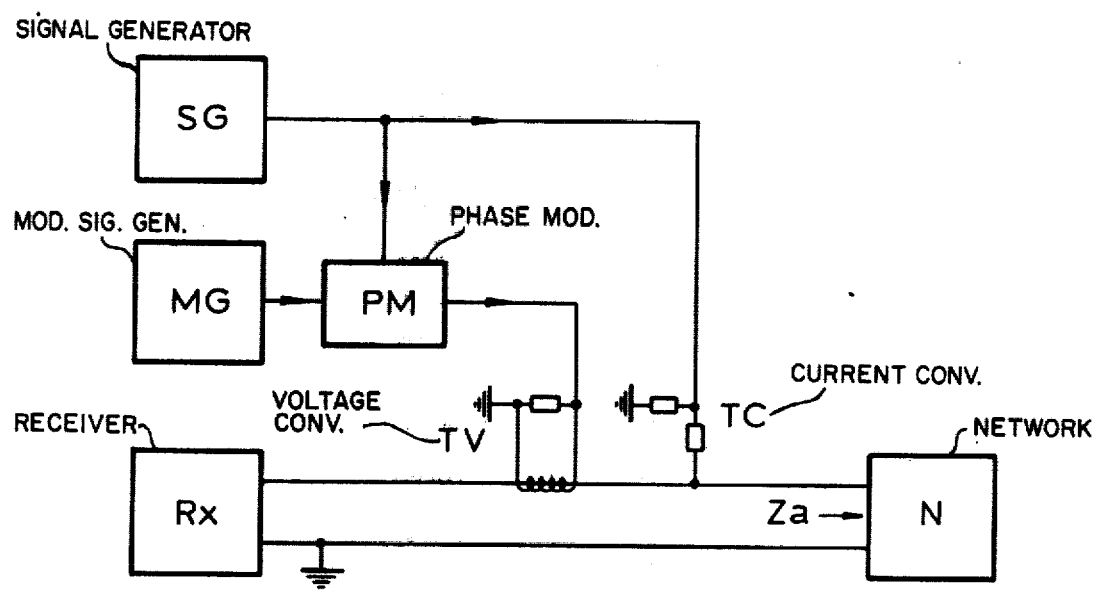
FIGS. 10 and 11 illustrate further embodiments.

The phase modulation method requires either of the injected signals to be phase modulated; the other is unmodulated as illustrated in FIG. 10 in which carrier energy from the generator SG is modulated by a phase modulator PM before being applied to the voltage converter TV.

It can be shown that the sign of the fundamental component in the amplitude demodulated received signal indicates the sign of the phase of the impedance under test.

The phase modulation method has the advantage that it uses the same converters as does non-phase impedance analysis; no extra, phase shifting, converter is required. However, phase modulation may prove difficult or expensive.

To perform phase analysis by the phase shift method, it is necessary to introduce a 90° difference between the injected r.f. signals and to amplitude modulate one of the signals with carrier suppression, commonly referred to as DSB modulation: the other signal is unmodulated.

Figure 11:
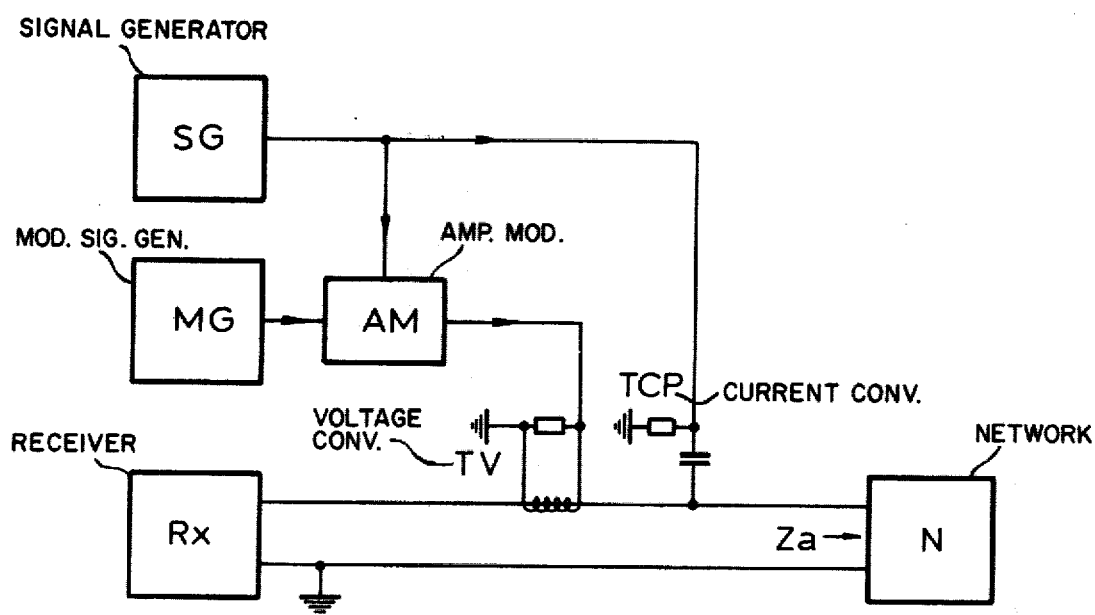

A very convenient means of introducing the required phase difference is to use a capacitive/resistive current converter instead of one that is wholly resistive, as illustrated in FIG. 11.

It can be shown that, again, the sign of the fundamental component in the demodulated signal indicates the sign of the phase of the impedance under test.

Figure 12:
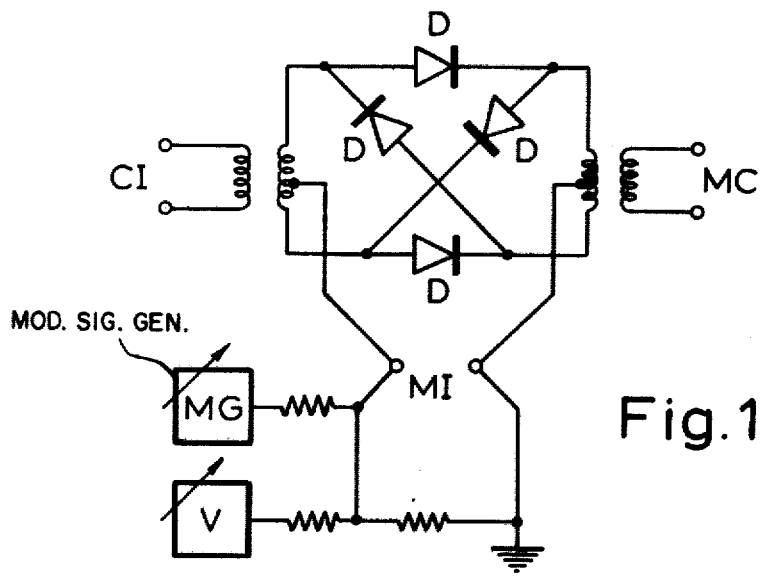
FIG. 12 illustrates a balanced modulator.

The modulators, the converters, the generators, the radio receiver and the synchronous detector will normally follow established designs. It can be advantageous to use balanced modulators and FIG. 12 shows a typical circuit of a suitable radio frequency balanced modulator with the usual ring of diodes, carrier signal (c.w.) input CI, modulation signal input MI and output MC at which appears the amplitude-modulated carrier.

Figure 13:
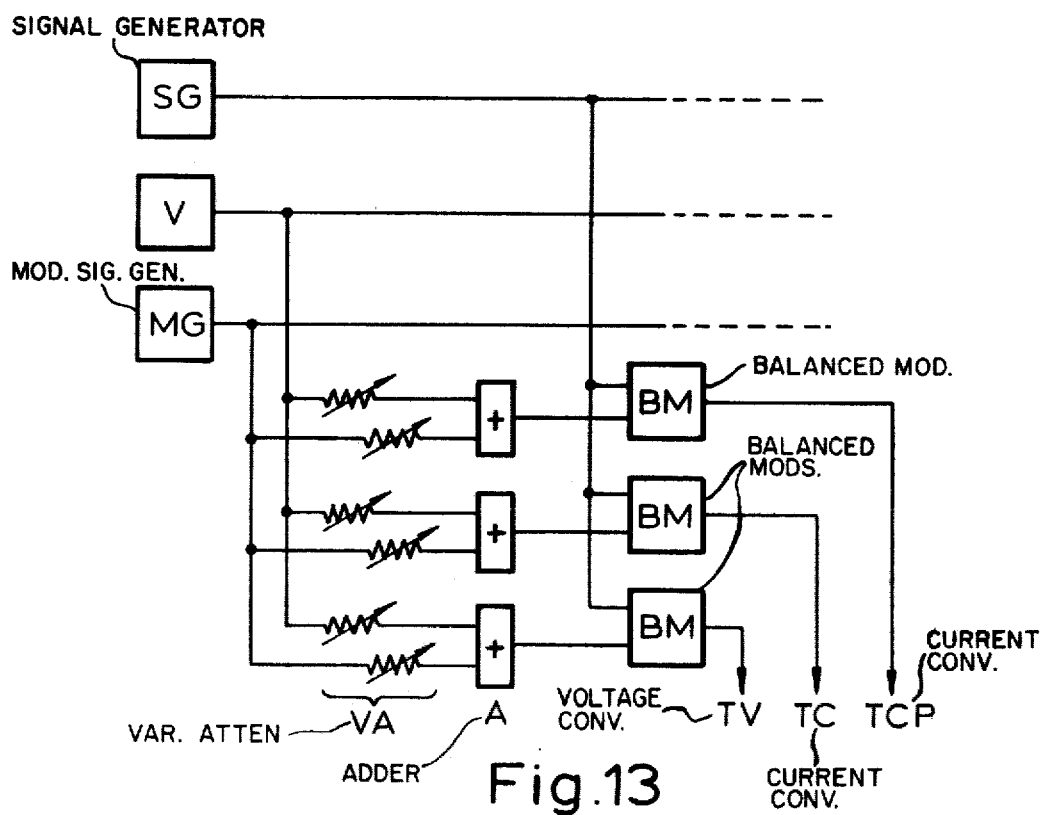
FIGS. 13 to 16 illustrate still further embodiments.

In this application each converter is connected to the port MC of its own modulator. The ports CI of all modulators are fed with a carrier containing the required measurement frequency. Independently-variable DC energy from a source V and energy from a modulation signal generator MG are mixed in an adder which may be a simple resistor arrangement as shown in FIG. 12 and the signal to each converter may then be controlled by varying the DC and the modulation signal inputs to the modulator; the DC level sets the carrier and the modulation signal level sets the AM sidebands. FIG. 13 shows an example of the principle. To enable phase analysis, it is desirable that each set of converters includes a phase shifting converter since phase modulation, although possible, is not straightforward with balanced modulators.

Figure 14:
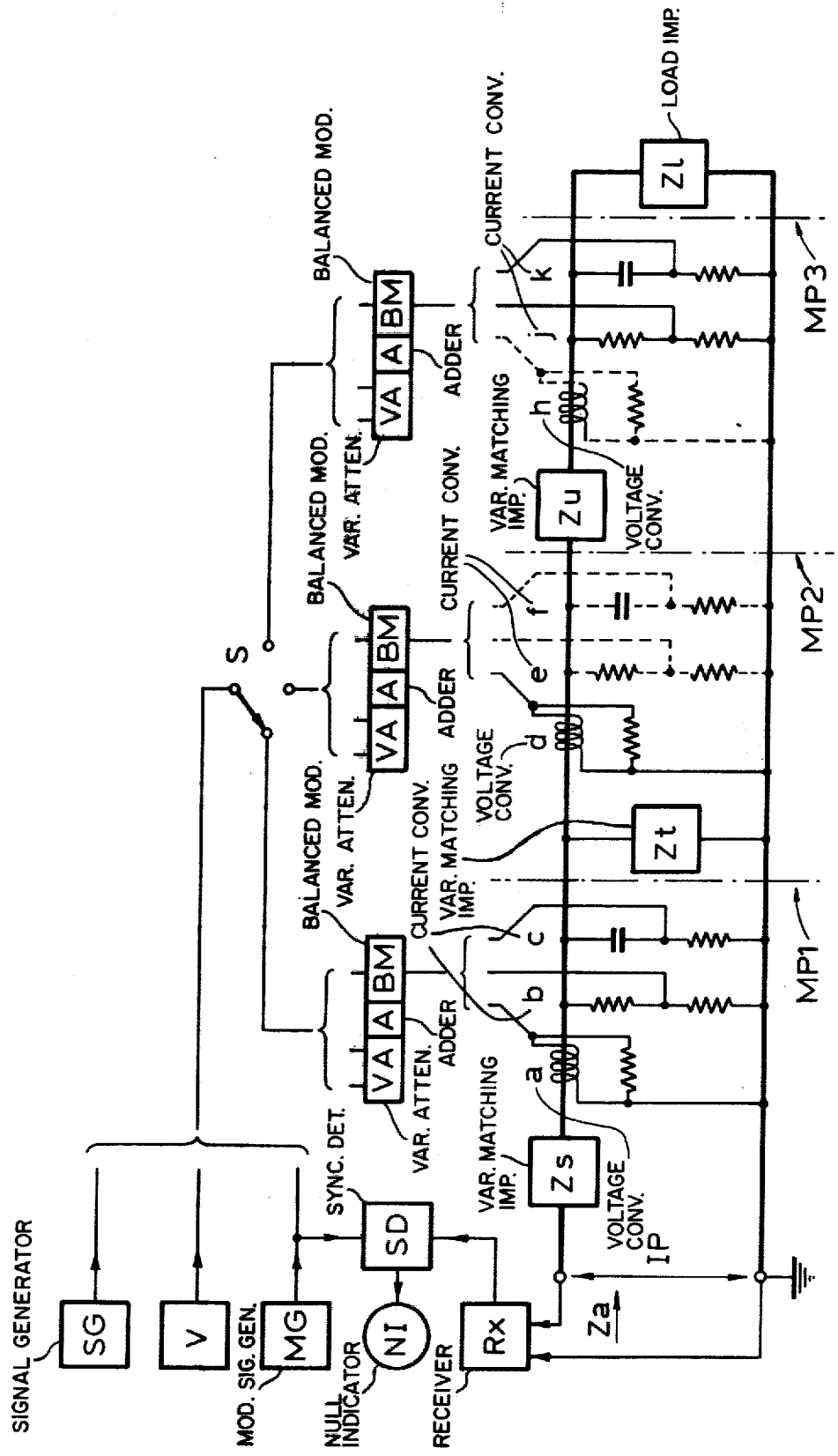

In FIG. 13 each converter is supplied from a balanced modulator BM which receives DC and modulation frequency energy, through an adder and individual variable attenuators VA, from source V and generator MG, respectively. Only one set of three converters is indicated in FIG. 13, but where impedance measurements are to be made at more than one point in a network, for example, when carrying out impedance-matching measurements and adjustments on an aerial system, converters would be provided at each of the points. Part of such an arrangement is illustrated in FIG. 14 which shows a network comprising a load impedance Z1 and variable matching impedances Zs, Zt and Zu which, when suitably adjusted, transform the impedance Z1 to some other desired impedance Za at the input port IP of the network. In FIG. 14 the various converters are indicated by a, b, c, - - - , k, and it will be understood that, although a set of converters may be separated from the radio receiver by a linear impedance, sensitivity may be reduced but the null loci will not be affected: as can be seen each set of converters is associated with a respective one of three measurement points MP1, MP2 and MP3.

If a node or a branch is common to two measurement points then one current or one voltage converter respectively will suffice for both points. Thus, if three complete sets of converters were provided at the three measurement points of FIG. 14, converters e, f and h, the connections to which are indicated in broken lines, would be redundant because they would duplicate the functions of converters b, c and d respectively: therefore, in the arrangement illustrated in FIG. 14 only converters a, j and k, together with either b or e, together with either c or f, together with either d or h would need to be provided.

The modulation-frequency output from the receiver Rx is applied to a synchronous detector SD, which also receives an input from the modulation generator MG, and the output from SD is supplied to any convenient form of indicating instrument, for example a null indicator NI.

In FIG. 14 the switch S, compare FIG. 3, illustrates diagrammatically the multi-point switching device necessary to switch, in turn, the parallel outputs from SG, V and MG simultaneously to apparatus, for example such as that illustrated in FIG. 13, associated with each of the measurement points: each such apparatus is indicated diagrammatically on FIG. 14 by the blocks VA, A and BM corresponding to those parts of FIG. 13. Alternatively, of course, if desired only a single arrangement such as that illustrated in FIG. 13 may be provided with the paralleled outputs from the three balanced modulators BM being applied through a multi-point switching device S to each of the measurement points in succession.

It will of course be understood that the use of such a switching device S, whether the switching be manual or automatic or mechanical or electronic, is in fact a time division multiplexing system which, if the switching speed is fast enough, permits impedance properties at a plurality of points to be measured substantially simultaneously. However, frequency division multiplexing is also feasible in which measurements are performed simultaneously but a different modulation frequency is used for each, together with a separate synchronous detector, for each frequency, fed from the receiver Rx. Care must be taken to avoid harmonic relations between the modulating frequencies.

Two measurements may be phase division multiplexed: synchronous detection can differentiate between two modulations in phase quadrature.

Figure 8:
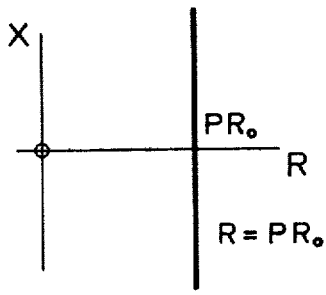

As can be seen from FIGS. 6 and 8, to alter a conductance or a resistance locus, only one real-axis intersection need by changed: for example, the intersection defined by the carrier level ratio can be adjusted by holding one direct-voltage signal constant and varying the other with, for example a potentiometer.

Figure 7:
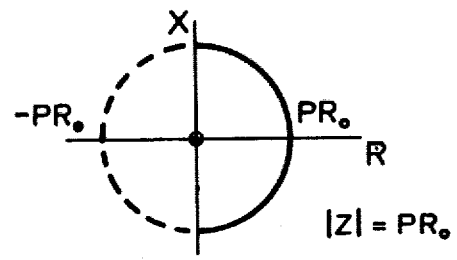

To alter an SWR or a modulus locus, see FIGS. 7 and 9, both real-axis intersections must be changed, so both the DC and AF ratios must be altered together, and the correct relationship between the ratios must be maintained. However, it is a simple matter to achieve this with a ganged potentiometer.

Figure 15:
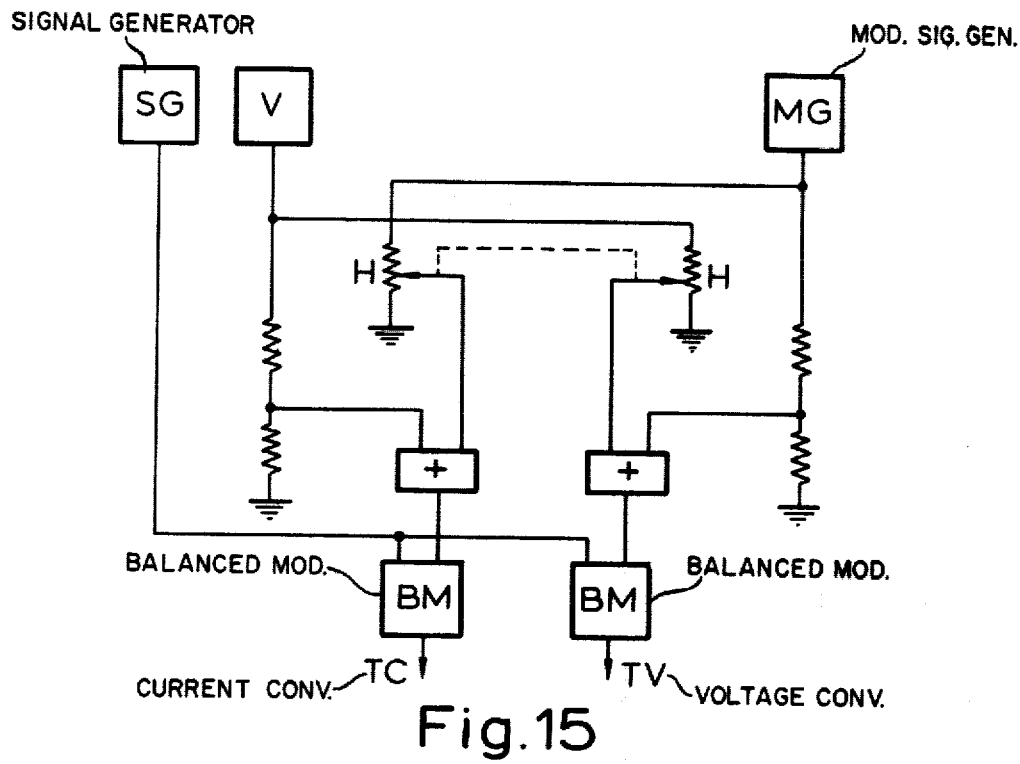

Therefore Conductance, Resistance, SWR and Modulus thresholds can each be varied with one control. Suitable dial calibration will produce a simple, very low signal level, impedance measuring device. FIG. 15 shows the principle applied to SWR measurements using ganged variable potentiometers H.

Figure 16:
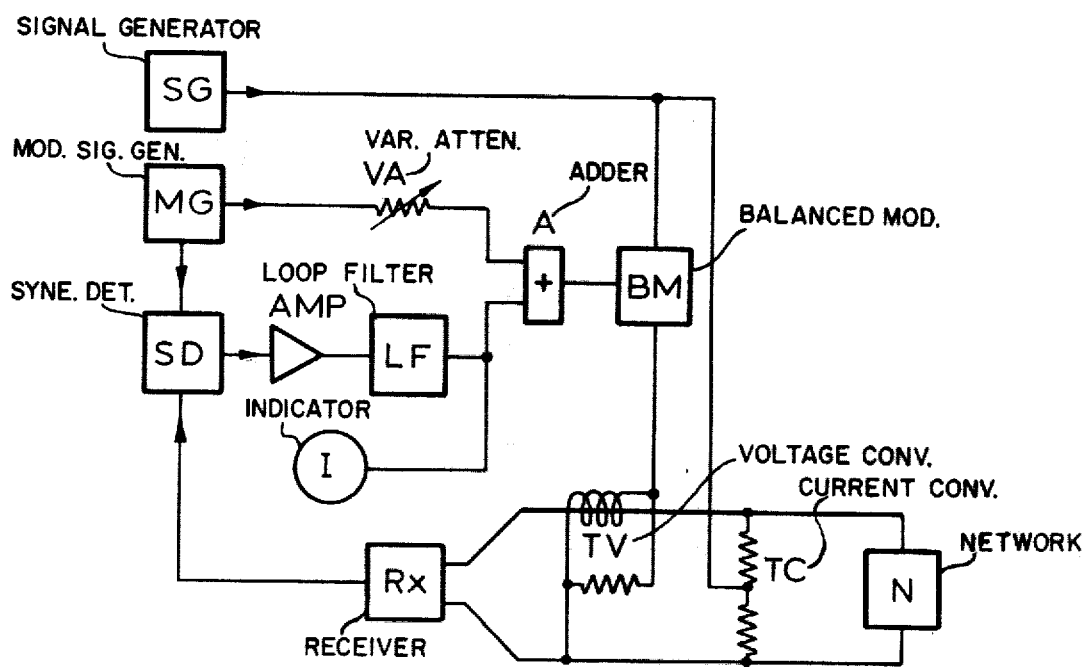

FIG. 16 shows a resistance analysing scheme similar to that described with reference to FIG. 13 but with the signal defining the resistance threshold, the DC input to the voltage modulator, derived from the output of the synchronous detector SD through an amplifier and the usual servo-system loop filter LF.

Thus, if the correct signal polarities are used, the resistance threshold will be adjusted automatically to coincide with the resitance of the impedance under test. The resulting magnitude of the DC applied to the voltage modulator will be a measure of the resistance.

The same principle can be applied to a conductance measuring arrangement. To measure SWR or modulus, a signal at the modulating frequency must be adjusted by the feedback loop, but this is not difficult to achieve.

If several appropriate properties of an impedance are measured in this way, the results can be combined, using an arithmetic unit for example, to provide a display of the impedance value in conventional form, e.g. Cartesian or Polar.

What we claim is:

1. Apparatus for deriving radio-frequency impedance information of an electrical network, comprising a source of radio-frequency signals, a radio receiver, and a transmission path having one end connected to a port of said electrical network and the other end connected to said radio receiver, said transmission path comprising two converters each for injecting a radio-frequency signal and consisting respectively of a current converter arranged for injecting a predetermined radio-frequency current derived from said source in parallel with said port and a voltage converter arranged for injecting a predetermined radio-frequency voltage derived from said source in series both with said port and with said radio receiver for producing resultant signals in said radio receiver from which said radio receiver derives an output indicative of a parameter of the radio-frequency impedance presented to said converters by said network at said port.

2. Apparatus as claimed in claim 1 which further comprises means for amplitude modulating the radio-frequency signal injected by at least one of said converters by a modulation signal of predetermined frequency and wherein said radio receiver comprises means for amplitude-demodulating said resultant signals thereby producing a demodulated signal.

3. Apparatus as claimed in claim 2 which further comprises means coupled to said radio receiver for synchronous detection at said predetermined frequency of the demodulated signal from said radio receiver.

4. A method of deriving radio-frequency impedance information of an electrical network, wherein the method comprises:
   coupling a radio receiver to a port of the network;
   generating two radio-frequency signals consisting respectively of a predetermined radio-frequency current and a predetermined radio-frequency voltage;
   injecting said radio-frequency current in parallel with said port of said network and injecting said radio-frequency voltage in series both with said port and with said radio receiver for producing resultant signals in said radio receiver;
   detecting said resultant signals with said radio receiver; and
   deriving, from the detected signals, information of the radio-frequency impedance presented by said network at said port.

5. A method as claimed in claim 4 wherein said radio-frequency current and said radio-frequency voltage are in phase with each other, and wherein said method further comprises phase modulating one of said radio-frequency signals prior to injection, and amplitude demodulating said resultant signals with said radio receiver, whereby the sign of the fundamental component of the demodulated signal indicates the sign of the phase of said radio-frequency impedance.

6. A method as claimed in claim 4 wherein said method further comprises:
   amplitude modulating with a signal of predetermined frequency at least one of the radio-frequency signals prior to injection, thereby producing amplitude-modulated resultant signals and, demodulating the amplitude-modulated resultant signals with the radio receiver, whereby, as said radio-frequency impedance approaches a circular locus in a diagram in a complex impedance plane, a fundamental component of the modulation frequency in a demodulated signal approaches zero.

7. A method as claimed in claim 6 wherein said radio-frequency current and said radio-frequency voltage differ in phase by 90 degrees and wherein said amplitude-modulating is performed on only one of said radio-frequency signals and in which said one radio-frequency signal acting as a carrier of an amplitude-modulated signal is suppressed, whereby the sign of the fundamental component of the demodulated signal indicates the sign of the phase of said radio-frequency impedance.

8. A method as claimed in claim 6 which further comprises synchronously detecting said demodulated signal at the modulation frequency whereby the fundamental component thereof may be extracted.

* * * * *